United States Patent [19]

Shimoda et al.

[11] Patent Number: 4,763,328
[45] Date of Patent: Aug. 9, 1988

[54] VITERBI DECODER AND METHOD FOR TESTING THE VITERBI DECODER

[75] Inventors: Kaneyasu Shimoda; Atsushi Yamashita; Tadayoshi Katoh, all of Kawasaki, Japan

[73] Assignee: Fujitsu Limited, Kawasaki, Japan

[21] Appl. No.: 919,698

[22] Filed: Oct. 16, 1986

[30] Foreign Application Priority Data

Oct. 29, 1985 [JP] Japan ................. 60-240667

[51] Int. Cl.$^4$ ............................................ G06F 11/00
[52] U.S. Cl. .................................. 371/3; 371/43
[58] Field of Search ................. 371/3, 24, 25, 43, 44, 371/45, 46; 340/347 DD

[56] References Cited

U.S. PATENT DOCUMENTS

| 4,240,156 | 12/1980 | Doland | 371/43 |
| 4,606,027 | 8/1986 | Otani | 371/43 |
| 4,614,933 | 9/1986 | Yamashita | 340/347 DD |
| 4,680,761 | 7/1987 | Burkness | 371/25 |

FOREIGN PATENT DOCUMENTS

155110 9/1985 European Pat. Off. ............. 371/43

OTHER PUBLICATIONS

P. E. C. Hoppes, et al., "A Monolithic CMOS Maximum-Liklihood Convolutional Decoder", IEEE, 1982, pp. 27-29.
S. Crozier, "Microprocessor Based Implentation and Testing of a Simple Viterbi Detector", Elec. Eng., vol. 6, No. 3, 1981, pp. 3-8.

*Primary Examiner*—Jerry Smith
*Assistant Examiner*—Robert W. Beausoliel
*Attorney, Agent, or Firm*—Staas & Halsey

[57] ABSTRACT

An integrated viterbi decoder structure and method, the viterbi decoder receives test input signals at a distributor, an ACS circuit and a path memory and compares the output signals generated by the test input signals with predetermined test signals so as to test the internal operations of the viterbi decoder without the need for complex logic housed with the viterbi decoder.

3 Claims, 13 Drawing Sheets

Fig. 4

| TIME | INPUT PATTERN ||||  OUTPUT PATTERN |||||||| NORMALIZED |
|---|---|---|---|---|---|---|---|---|---|---|---|---|---|
| | BRANCH METRIC |||| PATH SELECT SIGNAL |||||||| |
| | I+Q | I+Q̄ | Ī+Q | Ī+Q̄ | 0 | 1 | 2 | 3 | 4 | 5 | 6 | 7 | |
| 0 | 1 | 1 | 1 | 1 | 1 | 1 | 1 | 1 | 1 | 1 | 1 | 1 | 0 |
| 1 | 1 | 1 | 1 | 1 | 1 | 1 | 1 | 1 | 1 | 1 | 1 | 1 | 0 |
| 2 | 1 | 1 | 1 | 1 | 1 | 1 | 1 | 1 | 1 | 1 | 1 | 1 | 0 |
| 3 | 1 | 1 | 1 | 1 | 1 | 1 | 1 | 1 | 1 | 1 | 1 | 1 | 0 |
| 4 | 1 | 1 | 1 | 1 | 1 | 1 | 1 | 1 | 1 | 1 | 1 | 1 | 0 |
| ⋮ | | | | | | | | | | | | | ⋮ |
| 63 | 1 | 1 | 1 | 1 | 1 | 1 | 1 | 1 | 1 | 1 | 1 | 1 | 0 |
| 64 | 1 | 1 | 1 | 1 | 1 | 1 | 1 | 1 | 1 | 1 | 1 | 1 | 1 |
| 65 | 1 | 1 | 1 | 1 | 1 | 1 | 1 | 1 | 1 | 1 | 1 | 1 | 0 |

Fig. 5

| TIME | INPUT PATTERN | | | | OUTPUT PATTERN | | | | | | | | NORMALIZED |
|---|---|---|---|---|---|---|---|---|---|---|---|---|---|
| | BRANCH METRIC | | | | PATH SELECT SIGNAL | | | | | | | | |
| | I+Q | Ī+Q | I+Q̄ | Ī+Q̄ | 0 | 1 | 2 | 3 | 4 | 5 | 6 | 7 | |
| 0 | 0 | 7 | 7 | 14 | 1 | 1 | 1 | 1 | 1 | 1 | 1 | 1 | 0 |
| 1 | 0 | 7 | 7 | 14 | 0 | 1 | 1 | 0 | 1 | 1 | 1 | 1 | 0 |
| 2 | 0 | 7 | 7 | 14 | 0 | 1 | 1 | 0 | 0 | 0 | 0 | 0 | 0 |
| 3 | 0 | 7 | 7 | 14 | 0 | 1 | 1 | 0 | 1 | 1 | 0 | 0 | 0 |
| 4 | 0 | 7 | 7 | 14 | 0 | 1 | 1 | 0 | 1 | 1 | 1 | 1 | 0 |
| 5 | 0 | 7 | 7 | 14 | 0 | 1 | 1 | 0 | 1 | 1 | 0 | 0 | 0 |
| 6 | 0 | 7 | 7 | 14 | 0 | 0 | 1 | 0 | 1 | 1 | 1 | 1 | 0 |
| 7 | 0 | 7 | 7 | 14 | 0 | 0 | 1 | 0 | 1 | 1 | 0 | 0 | 0 |
| 8 | 14 | 7 | 7 | 0 | 0 | 0 | 1 | 0 | 1 | 1 | 0 | 0 | 0 |
| 9 | 0 | 7 | 7 | 14 | 0 | 0 | 0 | 1 | 1 | 1 | 0 | 0 | 0 |
| 10 | 7 | 14 | 0 | 7 | 0 | 1 | 0 | 0 | 0 | 0 | 1 | 1 | 0 |
| 11 | 7 | 0 | 14 | 7 | 0 | 0 | 1 | 1 | 0 | 1 | 0 | 0 | 0 |
| 12 | 7 | 14 | 0 | 7 | 1 | 1 | 0 | 0 | 1 | 1 | 1 | 1 | 0 |
| 13 | 7 | 0 | 14 | 7 | 1 | 1 | 0 | 0 | 1 | 1 | 1 | 1 | 0 |
| 14 | 0 | 7 | 7 | 14 | 0 | 0 | 1 | 1 | 1 | 1 | 1 | 1 | 0 |
| 15 | 14 | 7 | 7 | 0 | 1 | 1 | 1 | 1 | 0 | 0 | 1 | 1 | 0 |
| 16 | 7 | 0 | 14 | 7 | 1 | 0 | 0 | 0 | 0 | 0 | 1 | 1 | 0 |
| 17 | 14 | 7 | 7 | 0 | 1 | 1 | 0 | 0 | 0 | 0 | 0 | 1 | 0 |
| 18 | 7 | 0 | 14 | 7 | 1 | 1 | 1 | 1 | 1 | 1 | 0 | 0 | 0 |
| 19 | 7 | 14 | 0 | 7 | 0 | 0 | 1 | 1 | 1 | 0 | 0 | 0 | 0 |
| 20 | 0 | 7 | 7 | 14 | 0 | 0 | 1 | 1 | 1 | 1 | 1 | 1 | 0 |
| 21 | 7 | 14 | 0 | 7 | 1 | 1 | 1 | 1 | 1 | 1 | 0 | 0 | 0 |
| 22 | 14 | 7 | 7 | 0 | 1 | 1 | 0 | 0 | 0 | 0 | 1 | 0 | 0 |
| 23 | 0 | 7 | 7 | 14 | 1 | 1 | 1 | 1 | 0 | 0 | 1 | 1 | 0 |

| INPUT | | | OUTPUT |
|---|---|---|---|
| PATH SELECT SIGNAL | A | B | |
| 0 | 0 | 0 | 0 |
| 0 | 1 | 0 | 1 |
| 0 | 0 | 1 | 0 |
| 0 | 1 | 1 | 1 |
| 1 | 0 | 0 | 0 |
| 1 | 1 | 0 | 0 |
| 1 | 0 | 1 | 1 |
| 1 | 1 | 1 | 1 |

FIRST STAGE

Fig. 11

| TIME | INPUT PATTERN | | OUTPUT PATTERN |
|---|---|---|---|
| | PATH SELECT | FIRST STAGE | LAST STAGE |
| | 0 1 2 3 4 5 6 7 | 0 1 2 3 4 5 6 7 | 0 1 2 3 4 5 6 7 |
| 1 | 01010101 | 10000000 | 00000000 |
| 2 | 01010101 | 01000000 | 00000000 |
| 3 | 01010101 | 00100000 | 00000000 |
| 4 | 01010101 | 00010000 | 00000000 |
| 5 | 01010101 | 00001000 | 00000000 |
| 6 | 01010101 | 00000100 | 00000000 |
| 7 | 01010101 | 00000010 | 00000000 |
| 8 | 01010101 | 00000001 | 00000000 |
| 9 | 01010101 | 01111111 | 00000000 |
| 10 | 01010101 | 10111111 | 00000000 |
| 11 | 01010101 | 11011111 | 00000000 |
| 12 | 01010101 | 11101111 | 00000000 |
| 13 | 01010101 | 11110111 | 00000000 |
| 14 | 01010101 | 11111011 | 00000000 |
| 15 | 01010101 | 11111101 | 00000000 |
| 16 | 01010101 | 11111110 | 00000000 |
| 17 | 01010101 | 00000000 | 00000000 |
| 18 | 01010101 | 11111111 | 10000000 |
| 19 | 01010101 | 11111111 | 00001000 |
| 20 | 01010101 | 11111111 | 01000000 |
| 21 | 01010101 | 11111111 | 00000100 |
| 22 | 01010101 | 11111111 | 00100000 |
| 23 | 01010101 | 11111111 | 00000010 |
| 24 | 01010101 | 11111111 | 00010000 |
| 25 | 01010101 | 11111111 | 00000001 |
| 26 | 01010101 | 11111111 | 01111111 |
| 27 | 01010101 | 11111111 | 11101111 |
| 28 | 01010101 | 11111111 | 10111111 |
| 29 | 01010101 | 11111111 | 11111011 |
| 30 | 01010101 | 11111111 | 11011111 |
| 31 | 01010101 | 11111111 | 11111101 |
| 32 | 01010101 | 11111111 | 11101111 |
| 33 | 01010101 | 11111111 | 11111110 |
| 34 | 01010101 | 11111111 | 00000000 |
| 35 | 01010101 | 11111111 | 11111111 |

Fig. 12

| TIME | INPUT PATTERN | | OUTPUT PATTERN |
|---|---|---|---|
| | PATH SELECT | FIRST STAGE | LAST STAGE |
| | 0 1 2 3 4 5 6 7 | 0 1 2 3 4 5 6 7 | 0 1 2 3 4 5 6 7 |
| 36 | 10101010 | 10000000 | 11111111 |
| 37 | 10101010 | 01000000 | 11111111 |
| 38 | 10101010 | 00100000 | 11111111 |
| 39 | 10101010 | 00010000 | 11111111 |
| 40 | 10101010 | 00001000 | 11111111 |
| 41 | 10101010 | 00000100 | 11111111 |
| 42 | 10101010 | 00000010 | 11111111 |
| 43 | 10101010 | 00000001 | 11111111 |
| 44 | 10101010 | 01111111 | 11111111 |
| 45 | 10101010 | 10111111 | 11111111 |
| 46 | 10101010 | 11011111 | 11111111 |
| 47 | 10101010 | 11101111 | 11111111 |
| 48 | 10101010 | 11110111 | 11111111 |
| 49 | 10101010 | 11111011 | 11111111 |
| 50 | 10101010 | 11111101 | 11111111 |
| 51 | 10101010 | 11111110 | 11111111 |
| 52 | 10101010 | 00000000 | 11111111 |
| 53 | 10101010 | 11111111 | 00001000 |
| 54 | 10101010 | 11111111 | 10000000 |
| 55 | 10101010 | 11111111 | 00000100 |
| 56 | 10101010 | 11111111 | 01000000 |
| 57 | 10101010 | 11111111 | 00000010 |
| 58 | 10101010 | 11111111 | 00100000 |
| 59 | 10101010 | 11111111 | 00000001 |
| 60 | 10101010 | 11111111 | 00010000 |
| 61 | 10101010 | 11111111 | 11110111 |
| 62 | 10101010 | 11111111 | 01111111 |
| 63 | 10101010 | 11111111 | 11111011 |
| 64 | 10101010 | 11111111 | 10111111 |
| 65 | 10101010 | 11111111 | 11111101 |
| 66 | 10101010 | 11111111 | 11011111 |
| 67 | 10101010 | 11111111 | 11111110 |
| 68 | 10101010 | 11111111 | 11101111 |
| 69 | 10101010 | 11111111 | 00000000 |
| 70 | 10101010 | 11111111 | 11111111 |

FIRST STAGE

FIRST STAGE

VITERBI DECODER AND METHOD FOR TESTING THE VITERBI DECODER

BACKGROUND OF THE INVENTION

The present invention relates to an integrated circuit viterbi decoder and a method for testing the integrated circuit viterbi decoder. More particularly, the present invention relates to the testing of the internal operations of the an integrated circuit viterbi decoder.

A viterbi decoder is used to decode an encoded convolutional code using a maximum likelihood method. The decoder selects a path of a code sequence, which is most likely to be the received code sequence, from among a plurality of known code sequences. The decoder, therefore obtains the decoded data which corresponds to the selected path. Viterbi decoders are, for example, used for error correction in satellite communication systems.

As shown in FIG. 1, a viterbi decoder comprises a distributor 1, an Adder, Comparator and Selector (ACS) circuit 2 and a path memory 3. In general, the distributor 1 calculates a branch metric based upon the demodulated output from a receiver (not shown). The ACS circuit calculates a path metric and selects a maximum likelihood path. The path memory 3 stores the selected maximum likelihood paths. A viterbi decoder is discussed in U.S. Pat. No. 4,614,933 (Ser. No. 701,504 and assigned to the same assignee as this application), and is hereby incorporated by reference.

Increasing the constraint length of a convolutional code improves the error correction capability of the verterbi decoder. But, increasing the constraint length exponentially increases the physical size of the decoder. Therefore constraint lengths are typically selected to be in the range of 3 to 4. However, even with such constraint lengths, viterbi decoder circuits are very large, and can normally only be implemented using large scale integrated circuitry.

For example, when a coding rate of ½ together with a constraint length of 4 are assumed, and an 8-level probablistic code signal is received, decoded output signals I and Q (FIG. 1) of the orthogonally modulated signal are, for example three bits resulting in a total of six bits being applied to the distributor 1. For each of the three bit signals applied to the distributor 1, eight possible states exist. The ACS circuit 2 comprises eight adders, comparators and selectors, with eight outputs being applied to the path memory 3.

As is known, a viterbi decoder decodes a convolutional code. Therefore, the internal conditions or states of the viterbi decoder change in dependence upon the sequence of input signals. As a result, it is extremely difficult to operationally test a viterbi decoder.

Previously, a scan-in/scan-out testing method has been to test viterbi decoders. Such a method requires that many flip-flop circuits be constructed on the LSI chip along with the viterbi decoder circuitry, in order to generate the input/output signals needed to test the viterbi decoder logic circuit. In such a method, the test results are stored in each flip-flop and are read out of the viterbi decoder integrated circuit by an external tester.

As explained above, viterbi decoder circuitry is complicated and requires a large amount of area. There is therefore no extra area for mounting such flip-flop circuits used to test the viterbi decoder in accordance with the scan-in/scan-out testing method. Consequently, it is extremely difficult to test large scale integrated circuit viterbi decoders.

SUMMARY OF THE INVENTION

It is an object of the present invention to provide a method for easily testing a vertibi decoder by exercising each functional portion of a viterbi decoder.

It is another object of the present invention to provide an integrated circuit viterbi decoder which is responsive to external test signals, and provides the results of the test for each of the functional parts of the viterbi decoder.

The method for testing viterbi decoder according to the present invention includes selectively and directly inputting the test signals to each functional portion of the viterbi decoder in order to test each of the individual parts.

The above and other objects of the present invention will be more apparent to those skilled in the art as the present invention is more fully described in the following with reference to the accompanying drawings.

BRIEF DESCRIPTION OF THE DRAWINGS

FIG. 4 illustrates a test pattern for an adder and normalizing circuit;

FIG. 5 illustrates a test pattern for a comparator and selector circuit;

FIGS. 11 and 12 illustrate test patterns for a path memory; and

DETAILED DESCRIPTION OF THE PREFERRED EMBODIMENTS

Figure 1:
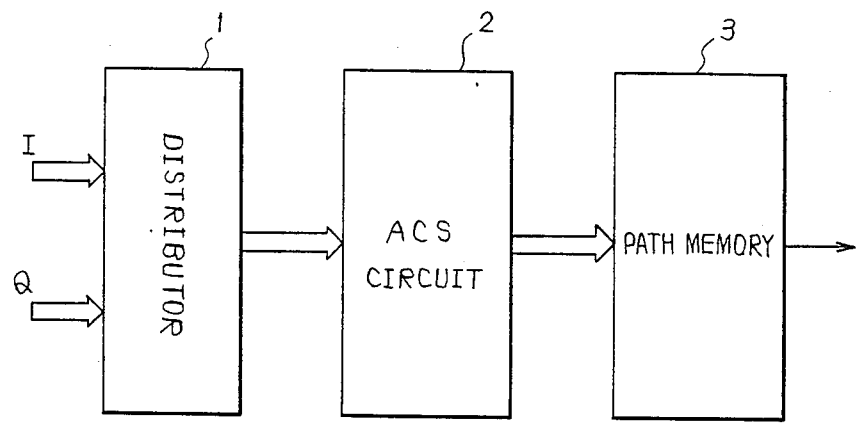
FIG. 1 is a block diagram of a viterbi decoder.
Figure 2:
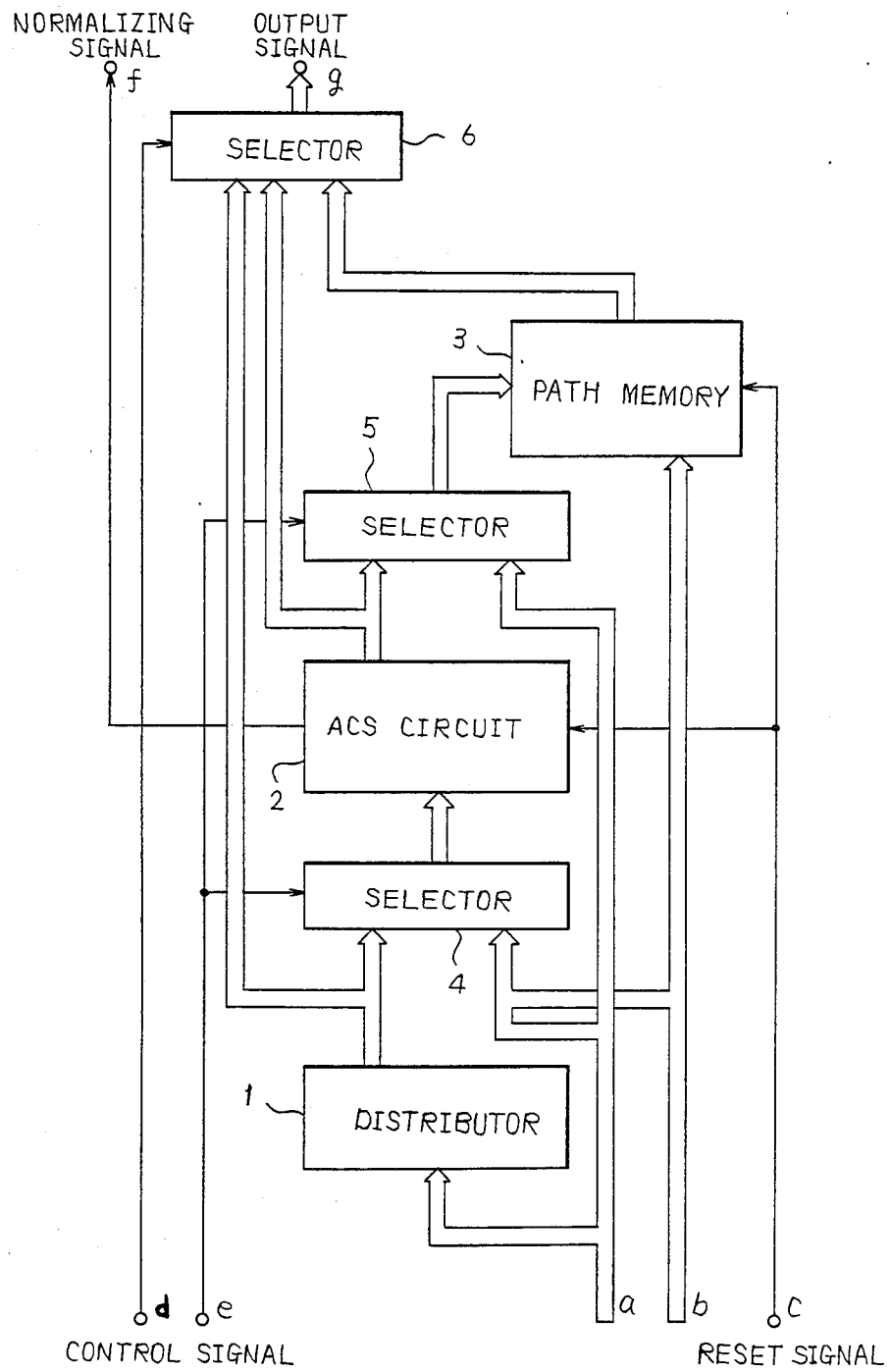
FIG. 2 is a block diagram of an embodiment of the present ivnention.

FIG. 2 is a block diagram of an LSI viterbi decoder embodying the present invention. A distributor 1 calculates branch metrics based upon an input signal received at terminal a. The signal applied to terminal a represents a demodulated signal received by the viterbi decoder. The output of the distributor 1 is applied to a selector 4 and to a selector 6; while the selected output of the selector 4 is applied to an ACS circuit 2. As described above, the ACS circuit 2 includes an adder, a comparator and a selector. The branch metrics and path metrics are added in the adder; the path metrics of the added outputs are compared by the comparator; and the maximum likelihood path is determined by comparing the path metrics. The result of the comparison selecting the maximum likelihood path via the selector and outputting this path from the selector 4. The ACS circuit 2 is reset by a reset signal which is applied to a terminal c. A normalizing signal applied to terminal f is also applied to the ACS circuit. As shown in FIG. 2, the output of the ACS circuit is applied to selectors 5 and 6.

A control signal applied to terminal e controls selectors 4 and 5; while the control signal received at terminal d controls selector 6. A path memory 3 comprises many cells which store the history of the maximum likelihood paths. The path memory 3 is reset by a reset signal received at terminal c. This reset signal resets a path memory 3 to its initial condition. An output of the path memory 3 is applied to the selector 6.

When testing the viterbi decoder, the output signal of distributor 1, the output of ACS circuit 2 and the output signal of the path memory can be selectively applied to an output terminal g via selector 6. During testing, test input signals are applied to terminals a and b. Use of these terminals for testing purposes as well as for normal inputs minimizes the number of terminals for a LSI viterbi decoder. It is also possible to provide individual test terminals for test inputs and test outputs, rather than to share the function of terminals in a manner such as illustrated in FIG. 2.

In an encoding system, the ratio of the number of bits applied to an encoder to the number of bits output by the encoder is termed the coding rate. In an encoder, the constraint length K, represents the number of bit shifts k within the encoder over which a single information bit can influence the encoder output. The following discusses a probablistic viterbi decoder with a coding rate of ½ and constraint length of 4.

The signals I and Q applied to the distributor 1 are each 3 bits and represent modulated signals correspsonding to the orthoganally modulated signal received by the viterbi decoder. The distributor 1 calculates 4 different types of branch metrics based on the received signals I and Q. Assuming that the respective branch metrics for the signals I and Q are $V_I$ and $V_Q$, the four types of branch metrics are expressed as follows.

$$V_I + V_Q \qquad \text{(i)}$$

$$V_I + (7 - V_Q) \qquad \text{(ii)}$$

$$(7 - V_I) + V_Q \qquad \text{(iii)}$$

$$(7 - V_I) + (7 - V_Q) \qquad \text{(iv)}$$

Since a maximum branch metric of 14 can be obtained in case (iv), a total of four bits are required to represent the possible branch metric. Therefore, the output of the distributor comprises four types of branch metrics, each represented by four bits making a total of sixteen (16) bits at the output of the distributor 1. When testing the viterbi decoder, test input signals are applied to the distributor 1 via input a. While a control signal is applied to selector 6 via an input terminal d. Under this condition, the output signal of the distributor 1 can be selectively output to output terminal g, and examined to determine if it corresponds to the proper output for the applied test signals.

The ACS circuit 2 comprises an adder which adds the branch metric calculated by the distributor 1 to the path metric for the previously received symbol; a comparator which compares the newly added path metrics and which controls a selector which selects the maximum likelihood path metric (e.g., the smaller path metric). The ACS circuit also includes a flip-flop circuit which holds the selected path metric for one symbol time period. That is, until the next path metric is calculated and the maximum likelihood path is selected. In general, the number of ACS circuits approaches $2^{K-1}$ in viterbi decoders with a constraint length of K. As discussed above, when the constraint length K is 4, a total of eight ACS circuits are needed.

Figure 3:
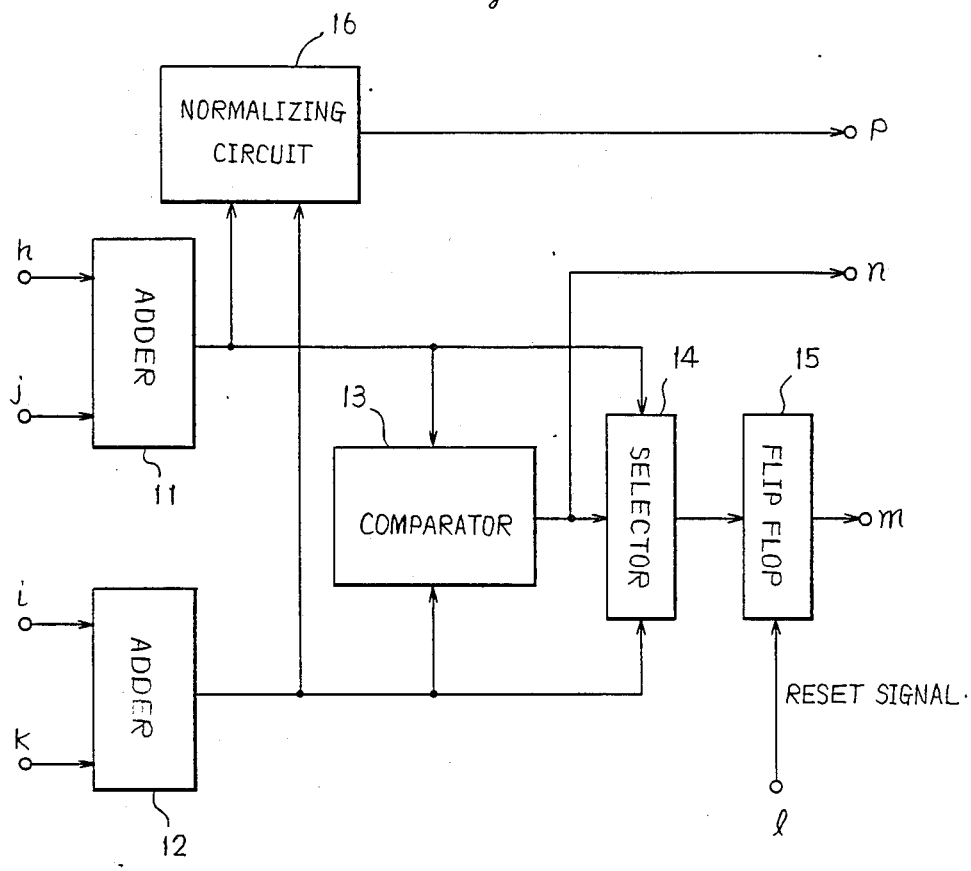
FIG. 3 is a block diagram of an ACS circuit.

FIG. 3 is block diagram of one of the eight ACS circuits included in the example of FIG. 2. In general, branch metrics are applied to terminals h and i while path metrics are applied to terminal j and k. An adder 11 adds the branch metric h to the path metric j and provides an output corresponding to this addition; while an adder 12 adds branch metric i to path metric k and provides an output representative of this addition. A normalizing circuit 16 monitors each of the ACS circuits and detects whether or not any one of the adders generates an overflow. If an overflow is detected, a constant value is subtracted from the output of each of the adders in all of the ACS circuits, and the result applied to the respective comparators and selectors such as 13 and 14 shown in FIG. 3. In addition, if normalization is required, a normalizing signal is output at terminal p.

In FIG. 3, the comparator compares the outputs of adders 11 and 12. For example, if the output of adder 11 is greater than the output of adder 12, the comparator would output a "1" and thus, the output of adder 12 would be applied to flip-flop 15 from selector 14. That is the minimum path metric (maximum likelihood) value is applied to flip-flop 15. The maximum likelihood path metric applied to flip-flop 15 from selector 14 is held in flip-flop 15 until the next symbol is received by the viterbi decoder.

When a reset signal is applied to the viterbi decoder, the reset signal reaches flip-flop 15 via terminal l. The reset signal also resets the normalizing circuit 16 and causes the normalizing circuit to provide a normalizing pulse at terminal p.

Testing of the ACS circuits includes testing of the adders 11 and 12, the normalizing circuit 16, the comparator 13 and selector 14. While testing the adders 11 and 12 and the normalizing circuit 16, flip-flop 15 is in the reset state due to a reset signal being applied to this flip-flop at terminal 1. The reset signal also initializes all path metrics in the path memory. When testing, a control signal at terminal e controls the selector 4 which has the test input signals from terminal a and b applied thereto. These test inputs are routed to the ACS circuit 2. The test input signal sets each of the branch metrics corresponding to the four different types of branch metrics calculated and outputted from distributor 1, to a "1" state. As testing progresses for various test inputs (i.e., received symbols), each path metric increases by "1". Assuming that the threshold value of the normalizing circuit 16 is "64," the accumulated path metrics execeed the threshold value of the normalizing circuit after receipt of the 64th symbol. If the circuitry is operating properly, a normalizing pulse should therefore be output by the normalizing circuit 16 at the terminal p at this time.

Under the testing conditions, the path metrics compared by the comparator such as 13 in the ACS circuits are equal. Thus, if either of the adders 11 and 12 malfunctions, a difference in path metrics occurs and the path select signal output by the comparator 13 changes. As a result, an error condition can be detected. Similarly, if the normalization circuit 16 fails no normalization pulse will be generated after receipt of the 64th symbol.

FIG. 4 illustrates a test pattern for testing the adders and normalization circuit of an ACS circuit. FIG. 4 illustrates the four types of branch metrics (I+Q), (I+$\bar{Q}$), ($\bar{I}$+Q), ($\bar{I}$+$\bar{Q}$), which are all set to "1." With this condition, the path select signals from each of the eight ACS circuits are set to "1" as shown in the output pattern portion of FIG. 4. The path metrics generated by adders 11 and 12 do not exceed the threshold value of "64" until after receipt of the 64th input pattern as shown in FIG. 4. As discussed above, if the circuitry is functioning properly a normalizing pulse would appear at the terminal p at this time. The patterns shown in FIG. 4 illustrate the patterns generated when the adders 11 and 12 and the normalizing circuit 16 are functioning properly.

In the test discussed above, the comparator 13 and selector 14 cannot be tested, and therefore, the test input signal is applied to the comparator 13 and to the selector 14. For example, when the branch metric corresponding to an error free received signal is applied to the ACS circuit 2, the comparator 13 of the ACS circuit can compare path metrics having a maximum range of 0:42. Thus, branch metrics are applied until the maximum comparison range of 0:42 is reached and the comparison completed.

FIG. 5 illustrates a test signal for the comparator 13 and selector 14. As in FIG. 4, FIG. 5 illustrates the four types of branch metrics discussed above; i.e., 0, 7, 7 and 14. The branch metrics, for example, 0, 7, 7 and 14 are applied to the ACS circuit 2 (FIG. 2) via the terminals a and b and selector 4. This initial test input makes each of the path select signals a "1" corresponding to the output of comparator 13 and appearing a terminal n for each of the ACS circuits. As each of the input patterns shown in FIG. 5 are applied to the ACS circuits, the output pattern shown in FIG. 5 should be obtained if the circuitry is functioning properly.

Figures 6, 7:
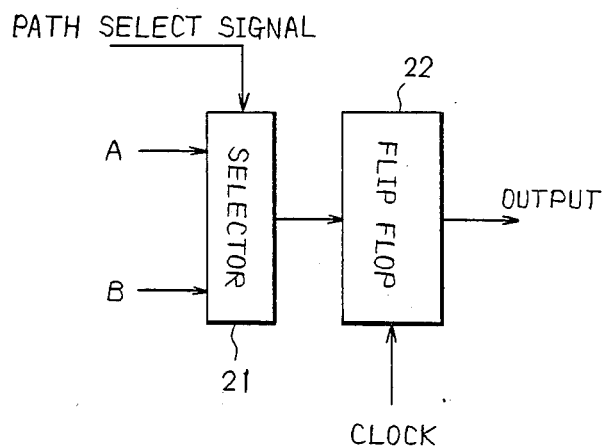
FIG. 6 is a block diagram of a path memory cell.
FIG. 7 illustrates a test pattern for testing the FIG. 6 path memory cell.

Path memory 3 (FIG. 2) comprises many memory cells for storing the history of selected paths. FIG. 6 illustrates one such cell of the path memory 3. The cell shown in FIG. 6 comprises a selector 21 and a flip-flop circuit 22. The selector 21 selects one of the path signals A and B, adds the selected ouput to the contents of flip-flop 22 and latches the result of this addition in the flip-flop 22 in accordance with the signal "clock" generated by the viterbi decoder.

FIG. 7 illustrates the relationship among the path select signal, input signal and output signal of flip-flop 22. When the path select signal is "0", the input A is selected and the corresponding output can be obtained. When the path select signal is "1" the input B is selected and the corresponding output can be obtained. Accordingly, eight combinations of inputs to the cell exist; corresponding to the eight states of the combined signals A, B and the path select signal, as shown in FIG. 7.

Figure 8:
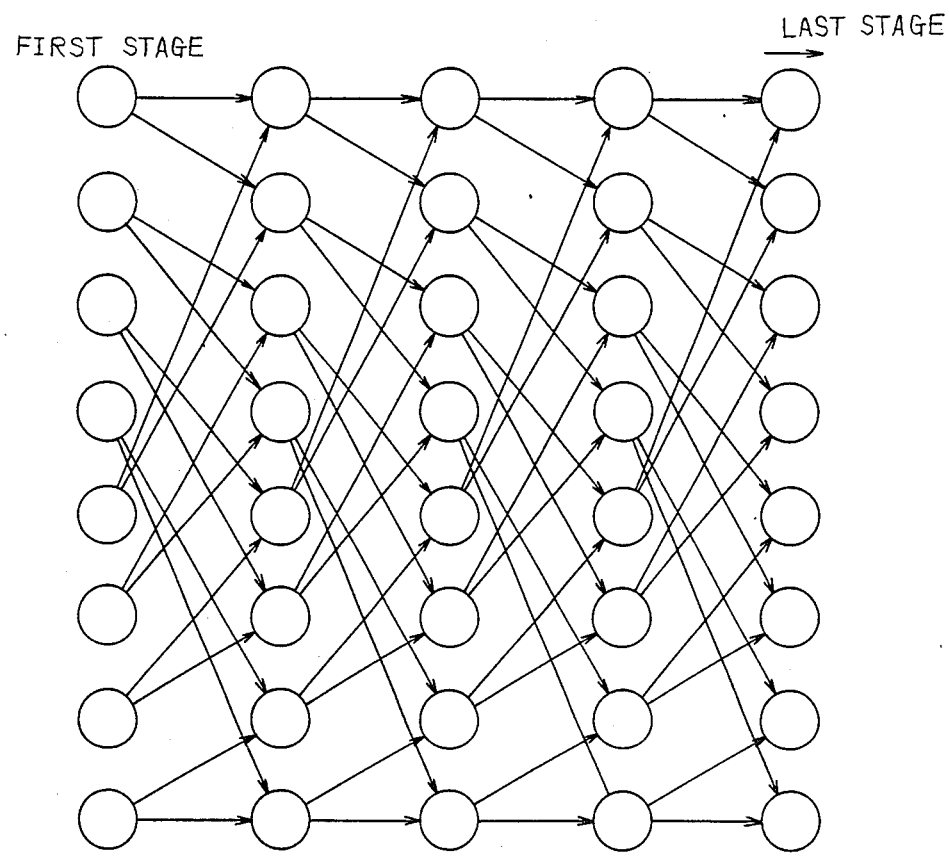
FIG. 8 is a trellis diagram of a viterbi decoder.

FIG. 8 is a trellis of a viterbi decoder, and represents the states of the path memory cells in path memory 3. Ideally, the number of stages of the path memory would be infinite, but if the number of stages is selected to be four to five times greater than the constraint length, the path memory is adequate. FIG. 8 illustrates 5 stages.

Figure 9:
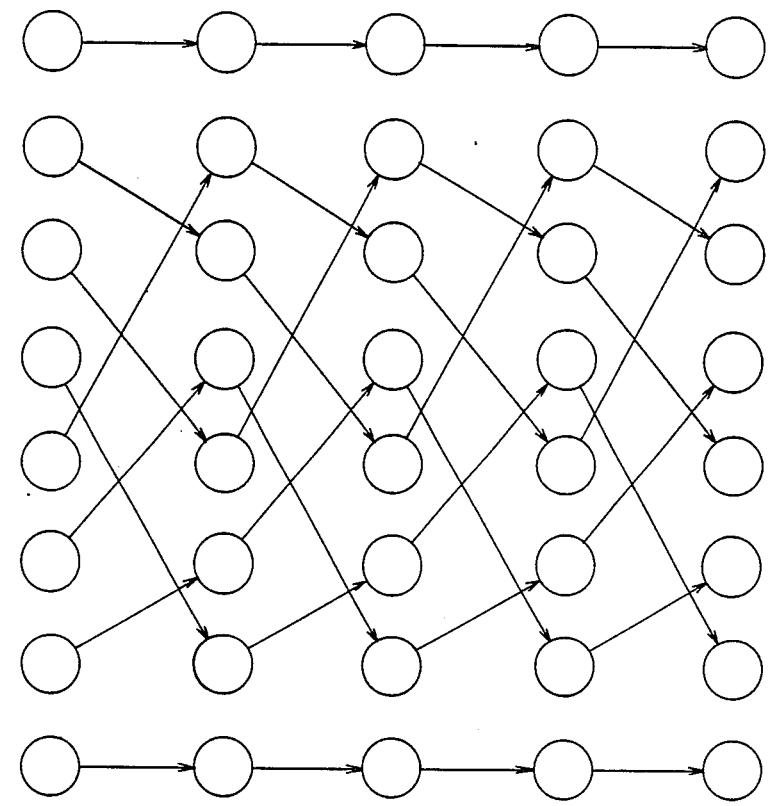
FIGS. 9 and 10 illustrate the coupling conditions of path memory cells.
Figure 10:
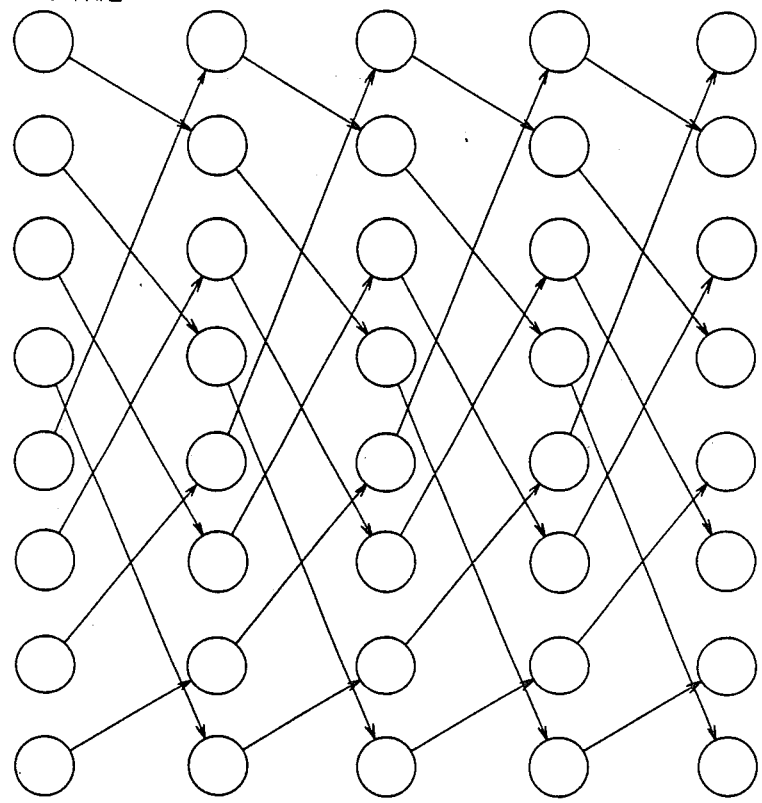

When the inputs of "01010101" or "10101010" are applied as path select signals, the path memory cells are coupled as shown in FIGS. 9 and 10, respectively. Since each memory cell can exist in one of eight different states, the memory cell must be set in each of the eight conditions in order to properly test the memory cell. Similarly, each of the cells must be tested in each of the eight conditions.

FIGS. 11 and 12 illustrate the test patterns for path memory 3. Seventy (70) test periods are illustrated. The input patterns shown in FIGS. 11 and 12 comprise a path select signal and an input to the first stage of the path memory. The output patterns shown in FIGS. 11 and 12 indicate the patterns at the final stage of a 17-stage structure.

Before testing the path memory 3, the path memory 3 is reset or initialized via the reset signal received at terminal c shown in FIG. 2. Thus, as shown in FIG. 11 the output pattern is set to all zeros. The test input signals are applied via terminal a through selector 5, and via terminal b, and the output signal is applied to terminal g via selector 6, as shown in FIG. 2. The input patterns of FIGS. 11 and 12 are applied as test input signals. The path select signal is assumed to be "01010101" for FIG. 9; while the path select signal is assumed to be "10101010" for FIG. 10. The input to the first stage of the path memory is the same for FIGS. 11 and 12. The output pattern, which corresponds to the input to the first stage of the path memory (e.g., as shown in FIGS. 9 and 10), appears at the output with a delay corresponding to the number of stages of the path memory, for example, 17 stages as discussed above.

In FIG. 11 with the test input of the first stage being "10000000," the output of "10000000" of the final stage corresponding to this input appears after the 18th stage symbol. Prior to this, the output of the last stage is a constant "00000000." The input "00000000" to the first stage at the 17th symbol becomes the output of the final stage after the receipt of the 34th symbol due to the delay of 17 stages. Similar operations also occur with the test pattern shown in FIG. 12. However, since the path select signal is reversed in FIG. 12 from that of FIG. 11, the output pattern in FIG. 12 is different from that in FIG. 11.

Figure 13:
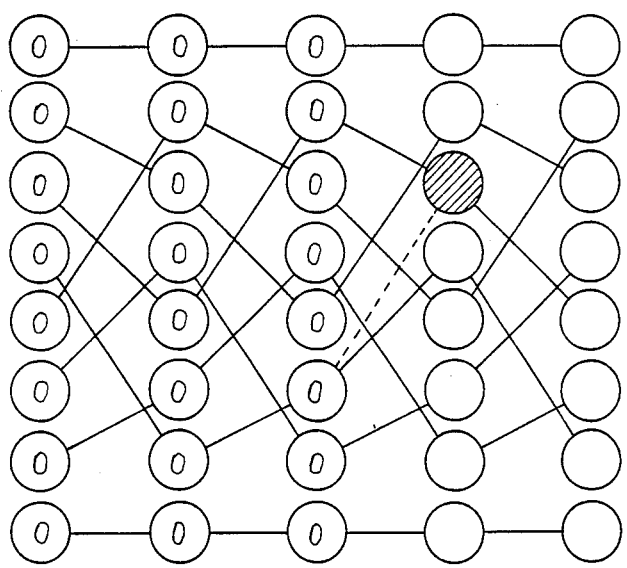
FIGS. 13 thru 16 illustrate path memory conditions to be tested.

FIGS. 13 thru 16 illustrate various conditions of path memory cells to be tested. When the path select signal is assumed to be "01010101" and the input to the first stage is "00000000" as shown in FIG. 13, the path select signal becomes zero for the shaded area shown in FIG. 13 this corresponds to the cell to be tested and the inputs A and B also becomes "0." Therefore, when an output from the cell to be tested is a "1" the flip-flop 22 (FIG. 6) of such a cell is determined to be defective.

Figure 14:
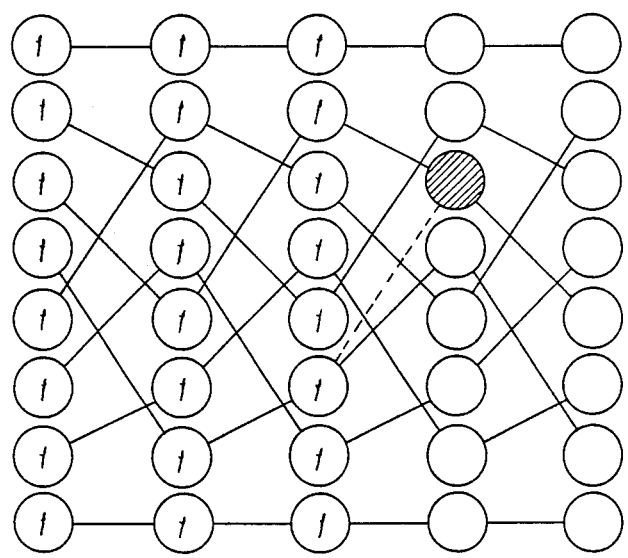

When an input to the first stage is assumed to be "11111111," the path select signal is a "0" and the inputs A and B are "1" for the cell to be tested. This situation is shown in FIG. 14. Therefore, when the output of a cell is "0" the flip-flop 22 of the cell is determined to be defective.

Figure 15:
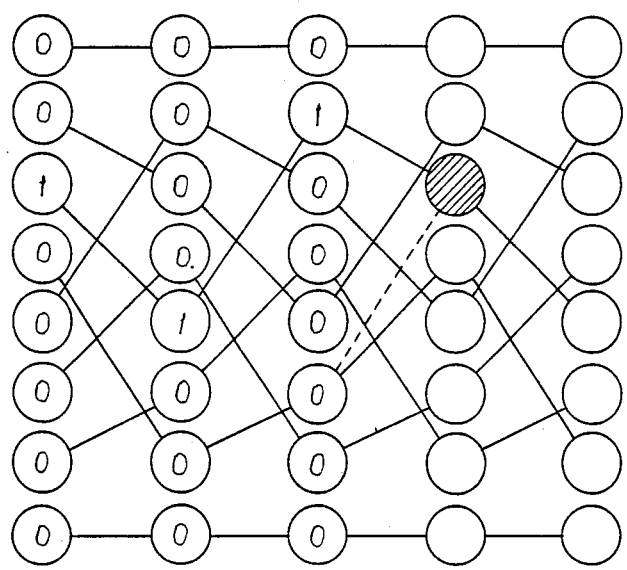

When an input to the first stage is assumed to be "00100000," the path select signal is a "0" and the inputs A and B are "1" and "0" respectively for the cell to be tested, as shown in FIG. 15. Therefore, when an output of the cell to be tested becomes "1" the flip-flop 22 is determined to be normal. However, when the output of the flip-flop 22 is "0" the selector 21 (FIG. 6) is determined to be defective because the flip-flop 22 was tested (as described above) as being normal.

Figure 16:
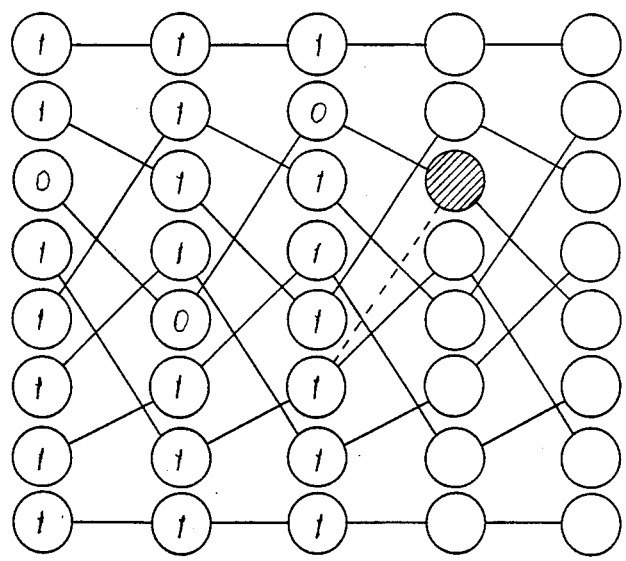

When an input to the first stage is assumed to be "11011111," the path select signal is a "0" and the inputs A and B are "0" and "1" respectively for the cell to be tested as shown in FIG. 16. Therefore, when an output of the cell is "0" the flip-flop 22 is determined to be normal. However, when the output is "1," the selector 22 is determined to be defective because the flip-flop 22 was tested (as described above) to be normal. A total of eight different conditions can be applied to the cell, including the conditions above, by applying the input stage with the test patterns of "00000000," "11111111," "00000100," and "11111011," together with path select signal of "10101010." The condition of each cell comprising the path memory can be tested by selecting the path select signal and input signal in the manner described above.

With the method and viterbi decoder structure of the present invention, the viterbi decoder operations can be tested by applying respective test input signals to the distributor 1, ACS circuit 2 and path memory 3 of the viterbi decoder, and collating these input signals with output signals from the decoder. The internal operations and conditions of the viterbi decoder are therefore capable of being tested with the present invention. It is also possible to automatically test a viterbi decoder by employing a microprocessor to generate the test patterns and to recognize the appropriate output signal patterns.

The many features and advantages of the present inventions will be apparent to those skilled in the art. The above descriptions are intended merely to be illustrative, and not to limit the scope of the present invention. Instead, the appended claims define the scope of the invention.

What is claimed is:

1. An integrated viterbi decoder for decoding received code sequences, comprising:
   input means for receiving test code sequences and for outputting signals varying in accordance with said received test code sequences;
   distributor means, operatively connected to said input means, for calculating branch metrics and for outputting signals responsive to said calculation;
   first selector means, operatively connected to receive first control signals, to said input means and to said distributor means, for selectively providing said signals output from said distributor means and from said input means in accordance with said first control signals;
   ACS means, operatively connected to said input means and to said distributor means, for adding branch metrics in order to generate path metrics, for comparing the generated path metrics, for selecting a maximum likelihood path in accordance with the results of comparing the path metrics, and for outputting signals responsive to said selection;
   second selector means, operatively connected to receive the first control signal, to said ACS means and to said input means, for selectively providing said signals from said ACS means and from said input means in accordance with the first control signals;
   path memory means, operatively connected to said ACS means and to said input means, for storing an initial predetermined pattern and for storing transitions in the maximum likelihood path selected by said ACS means; and
   output means, operatively connected to receive second control signals, to said distributor means, to said ACS means and to said path memory means, for selectively providing said signals output from said distributor means, said ACS means and to said path memory means, for selectively providing said signals output from said distributor means, said ACS means and said path memory means in accordance with said second control signals.

2. An integrated viterbi decoder according to claim 1, wherein said input means includes means for selectively receiving code sequences and said test code sequences.

3. A method for testing an integrated viterbi decoder having a distributor for calculating branch metrics, an ACS circuits for adding the branch metrics to generate path metrics, comparing path metrics and selecting the maximum likelihood path, and a path memory for storing transistions in the maximum likelihood path selected by the ACS circuit, said method comprising the steps of:
   resetting the ACS circuit and the path memory;
   applying predetermined test code sequences to the distributor, the ACS circuit and the path memory respectively;
   selectively providing and sampling the outputs of the distributor, the ACS circuit and the path memory; and
   comparing the read outputs of the distributor, the ACS circuit and the path memory with predetermined test codes sequences.

* * * * *